(12) United States Patent
Strickling et al.

(10) Patent No.: US 11,782,809 B2
(45) Date of Patent: Oct. 10, 2023

(54) TEST AND MEASUREMENT SYSTEM FOR ANALYZING DEVICES UNDER TEST

(71) Applicant: Tektronix, Inc., Beaverton, OR (US)

(72) Inventors: Sam J. Strickling, Portland, OR (US); Daniel S. Froelich, Portland, OR (US); Michelle L. Baldwin, Mount Juliet, TN (US); Jonathan San, Palo Alto, CA (US); Lin-Yung Chen, New Taipei (TW)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 17/359,261

(22) Filed: Jun. 25, 2021

(65) Prior Publication Data
US 2021/0406144 A1 Dec. 30, 2021

Related U.S. Application Data

(60) Provisional application No. 63/046,595, filed on Jun. 30, 2020.

(51) Int. Cl.
*G06F 11/26* (2006.01)
*G06F 11/24* (2006.01)

(52) U.S. Cl.
CPC .............. *G06F 11/26* (2013.01); *G06F 11/24* (2013.01)

(58) Field of Classification Search
CPC .................................. G06F 11/24; G06F 11/26
See application file for complete search history.

(56) References Cited

U.S. PATENT DOCUMENTS

| 4,881,230 | A | * | 11/1989 | Clark | G06F 11/2257 714/712 |
| 6,138,257 | A | * | 10/2000 | Wada | G01R 31/31935 714/724 |
| 6,175,261 | B1 | * | 1/2001 | Sundararaman | G11C 17/18 327/525 |
| 6,359,459 | B1 | * | 3/2002 | Yoon | G01R 31/40 324/762.01 |
| 6,453,435 | B1 | * | 9/2002 | Limon, Jr | G01R 31/31912 714/724 |
| 6,473,871 | B1 | * | 10/2002 | Coyle | G06F 11/221 714/715 |
| 6,640,320 | B1 | * | 10/2003 | Holaday | G11C 29/14 714/719 |
| 6,823,485 | B1 | * | 11/2004 | Muranaka | G11C 29/18 365/201 |

(Continued)

FOREIGN PATENT DOCUMENTS

| EP | 3136242 A1 | * | 3/2017 | .......... G06F 11/2236 |
| EP | 3379268 A1 | * | 9/2018 | ............. G01R 13/02 |
| WO | WO-2020137096 A1 | * | 7/2020 | |

Primary Examiner — Matthew M Kim
Assistant Examiner — Indranil Chowdhury
(74) Attorney, Agent, or Firm — Miller Nash LLP; Andrew J. Harrington

(57) ABSTRACT

A test and measurement system for analyzing a device under test, including a database configured to store test results related to tests performed with one or more prior devices under test, a receiver to receive new test results about a new device under test, a data analyzer configured to analyze the new test results based on the stored test results, and a health score generator configured to generate a health score for the new device under test based on the analysis from the data analyzer.

17 Claims, 3 Drawing Sheets

(56) References Cited

U.S. PATENT DOCUMENTS

| | | | |
|---|---|---|---|
| 7,222,280 B1* | 5/2007 | West | G11C 29/56004 714/736 |
| 8,230,265 B2* | 7/2012 | Rajashekara | G06F 11/3676 714/38.11 |
| 8,935,676 B2* | 1/2015 | Verbest | G06F 11/3672 717/131 |
| 8,990,639 B1* | 3/2015 | Marr | G06F 11/24 714/47.3 |
| 9,098,500 B1* | 8/2015 | Asokan | G06F 16/93 |
| 9,530,488 B1* | 12/2016 | Balasubramanian | G11C 11/419 |
| 10,151,791 B1* | 12/2018 | Spinner | G01R 1/0416 |
| 10,372,573 B1* | 8/2019 | Kim | G06F 11/26 |
| 11,349,311 B2* | 5/2022 | Kuroda | H02J 13/00 |
| 2003/0139906 A1* | 7/2003 | Barford | G01R 31/318314 702/183 |
| 2004/0138772 A1* | 7/2004 | Barman | G06F 30/00 700/97 |
| 2004/0267486 A1* | 12/2004 | Percer | G06F 11/24 702/120 |
| 2005/0162799 A1* | 7/2005 | Anand | G11C 17/18 361/115 |
| 2005/0283697 A1* | 12/2005 | Kang | G06F 11/263 714/742 |
| 2006/0067391 A1* | 3/2006 | Garlepp | H04L 1/242 375/224 |
| 2007/0184680 A1* | 8/2007 | Choi | G01R 1/0433 439/66 |
| 2007/0234141 A1* | 10/2007 | Ausserlechner | G11C 29/12005 714/718 |
| 2007/0244663 A1* | 10/2007 | Haemel | G06F 11/26 702/121 |
| 2008/0270854 A1* | 10/2008 | Kopel | G11C 29/56008 714/719 |
| 2008/0313583 A1* | 12/2008 | Brinson | G06F 30/33 716/136 |
| 2009/0006066 A1* | 1/2009 | Behm | G06F 30/33 703/15 |
| 2009/0027973 A1* | 1/2009 | Nakayama | G11C 17/18 365/207 |
| 2009/0112505 A1* | 4/2009 | Engel | G01D 21/00 702/123 |
| 2009/0164931 A1* | 6/2009 | Kemmerling | G01R 31/318 715/771 |
| 2009/0224793 A1* | 9/2009 | Kemmerling | G01R 31/318307 717/106 |
| 2010/0088560 A1* | 4/2010 | Chakravarthy | G01R 31/31718 714/724 |
| 2011/0099440 A1* | 4/2011 | Mims | G01R 31/31816 714/726 |
| 2011/0172946 A1* | 7/2011 | Bazemore | G01S 7/40 702/119 |
| 2011/0299349 A1* | 12/2011 | Deng | G11C 29/50 365/201 |
| 2015/0347282 A1* | 12/2015 | Wingfors | G06F 11/3688 717/125 |
| 2016/0302710 A1* | 10/2016 | Alberts | A61B 5/7271 |
| 2017/0149634 A1* | 5/2017 | Bezold | G06F 11/221 |
| 2017/0219651 A1* | 8/2017 | Kusko | G01R 31/318314 |
| 2018/0205621 A1* | 7/2018 | Ungar | G01R 31/31905 |
| 2019/0162779 A1* | 5/2019 | Lee | G01R 31/31924 |
| 2019/0325090 A1* | 10/2019 | Muthiah | G06F 30/3323 |
| 2021/0148964 A1* | 5/2021 | Sun | G01R 31/2834 |
| 2021/0157698 A1* | 5/2021 | Song | G06F 11/26 |
| 2021/0173010 A1* | 6/2021 | Hsu | G01R 31/318314 |
| 2021/0286693 A1* | 9/2021 | Alben | G06F 11/24 |
| 2021/0286696 A1* | 9/2021 | Franz | A61B 90/361 |
| 2021/0294735 A1* | 9/2021 | Hicks | G06F 11/079 |
| 2022/0208678 A1* | 6/2022 | Schultz | H01L 21/823871 |
| 2022/0318111 A1* | 10/2022 | Choudhary | G06F 11/24 |

* cited by examiner

TEST AND MEASUREMENT SYSTEM FOR ANALYZING DEVICES UNDER TEST

PRIORITY

This disclosure claims the benefit of U.S. Provisional Application No. 63/046,595, titled "BIG SILICON DATA AND COORDINATION," filed on Jun. 30, 2020, which is incorporated herein by reference in its entirety.

TECHNICAL FIELD

This disclosure is directed to systems and methods related to test and measurement systems, and in particular, to test and measurement systems that can analyze a device under test (DUT) based on data related to other tests performed by the test and measurement system.

BACKGROUND

Designers and manufacturers of electrical devices require test and measurement instruments and appropriate test procedures to ensure that the electrical devices function properly. Such testing may be done during an engineering characterization stage of designing a new device to, for example, compare actual electrical performance of the device to a simulated performance to ensure that the device is performing as designed.

Generally, to test compliance, a user will connect the device to a bit error rate tester (BERT) and/or a vector network analyzer (VNA) to test the actual electrical performance of the device. However, such testing setups may not only be very expensive, but may also take a significant amount of manual labor. If the new device ends up not passing the testing, then the device must be redesigned and the testing repeated. Sometimes the device may not pass the test, even though the simulated performance passed testing, and a user must spend time debugging their newly designed device to determine why the actual device is testing different from the simulation.

Examples of the disclosure address these and other deficiencies of the prior art.

BRIEF DESCRIPTION OF THE DRAWINGS

Aspects, features and advantages of examples of the present disclosure will become apparent from the following description of examples in reference to the appended drawings in which.

DESCRIPTION

A margin tester or system is a test and measurement instrument that can perform high-speed electrical margin tests on a DUT. A margin tester can establish a single-lane or multi-lane high speed input/output link of a DUT to assess an electrical margin of either the single-lane or each lane of the multi-lane high speed input/output link in either or both the transmitting direction or the receiving direction.

U.S. patent application Ser. No. 16/778,249 and U.S. patent application Ser. No. 16/778,262, each filed Jan. 31, 2020, each of which is incorporated in reference in its entirety, disclose systems and methods for performing high-speed electrical margin tests on a DUT. Such margin testers may be particularly useful for testing DUTs that employ multi-lane communication protocols such as Peripheral Component Interconnect (PCI) Express, for example.

Figure 1:
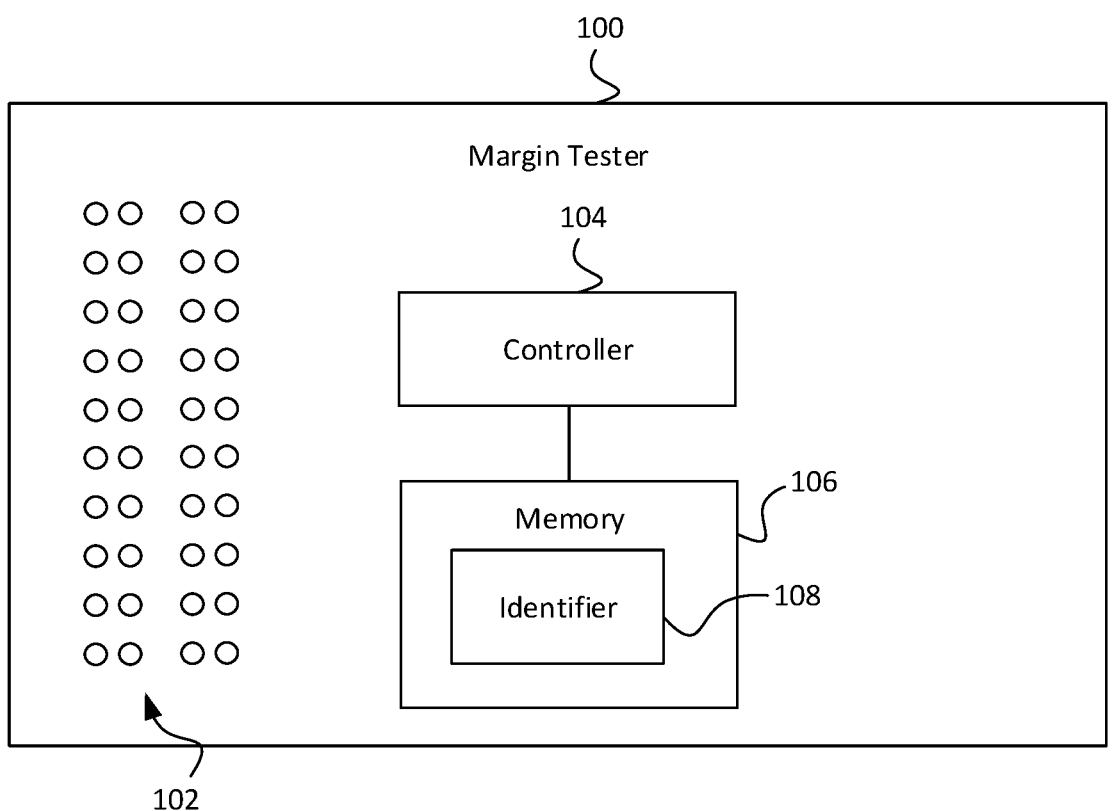
FIG. 1 is a block diagram of a margin tester according to some examples of the disclosure.

FIG. 1 is a block diagram illustrating a margin tester 100 with a number of interfaces 102 configured to be connected, e.g., via one or more cables, to at least one test fixture to assess the electrical margin of the multi-lane high speed I/O link of the DUT in either or both transmit and receive directions, according to an example of the disclosure.

The margin tester 100 includes a controller 104 and associated memory 106, which may store instructions and other data the controller 104 may read, use and/or execute to perform the functions described herein. The margin tester 100 may include some number of lanes that can be connected, e.g., cabled, to standard test fixtures, cables, or adaptors via interfaces 102 to carry out, under control of the controller 104, margin testing. The margin tester 100 includes transmitters and/or receivers (not shown) connected to the interfaces 102.

The controller 104 may be configured to assess the electrical margin of the single-lane or multi-lane high speed input/output (I/O) link by at least being configured to inject reduction of eye width opening by injecting jitter on margin test transmitters (or implementing other eye width opening reduction methods), the injection of jitter being selectable to be applied on all lanes of the single-lane or multi-lane high speed I/O link simultaneously or applied independently per lane of the of the single-lane or multi-lane high speed I/O link. Also, the controller 104 may be configured to assess the electrical margin of the single-lane or multi-lane high speed I/O link by at least being configured to inject reduction of eye height opening by injecting noise on margin tester 100 transmitters (or implementing other eye height opening reduction methods), the injection of noise being selectable to be applied on all lanes of the single-lane or multi-lane high speed I/O link simultaneously or applied independently per lane of the of the single-lane or multi-lane high speed I/O link.

The margin tester 100 can support multiple protocols and the configuration of the controller 104 of the margin tester 100 includes options to configure the lanes for different protocols and host/device roles. The margin tester 100 may also be used to test add-in cards by cabling to test fixtures, including the standard PCI Express Compliance Base Board (CBB) for testing add-in cards.

During assessing the electrical margin, the controller 104 can compare the measured electrical margin of a DUT with an expected electrical margin. A DUT may need to exceed a certain margin to be considered minimally compliant. However, the margin that needs to be exceeded can vary based on the effects of the margin tester and any adaptors or accessory attached between the margin tester and the DUT.

The controller 104 may also be coupled to memory 106, which may store instructions and other data the controller 104 may read, use and/or execute to perform the functions described herein. For example, the memory 106 may store an identifier 108 of the margin tester 100. The identifier 108 can be any unique identifier, such as, but not limited to, a serial number of the margin tester 100. The memory 106 may also store any expected margins for the DUT.

The interfaces 102 of the margin tester 100 may include standard co-axial connectors and cables for each high speed differential signal or, in various other embodiments, include custom high density connectors and fixtures to minimize the cable count and make switching from one DUT to another DUT more efficient. For example, a high-density connector adaptor to connect to a specific mechanical form-factor of a DUT can be used to connect to the Margin Tester 100 to the DUT. An example of a specific mechanical form-factor may be a specific type of PCI Express motherboard slot. That is, the adaptor may have one end that connects to the interface 102 of the margin tester 100 and another end that is a specific type of PCI Express motherboard slot. A high-density adaptor can be any adaptor that has eight or more connection points.

While the margin tester 100 discussed in FIG. 1 is used to describe various examples of the disclosure, as will be understood by one skilled in the art, examples of the disclosure are not limited to margin testers 100 and may apply to any test and measurement instrument, such as, but not limited to, an oscilloscope, a bit error rate tester, a vector network analyzer, etc.

Figure 2:
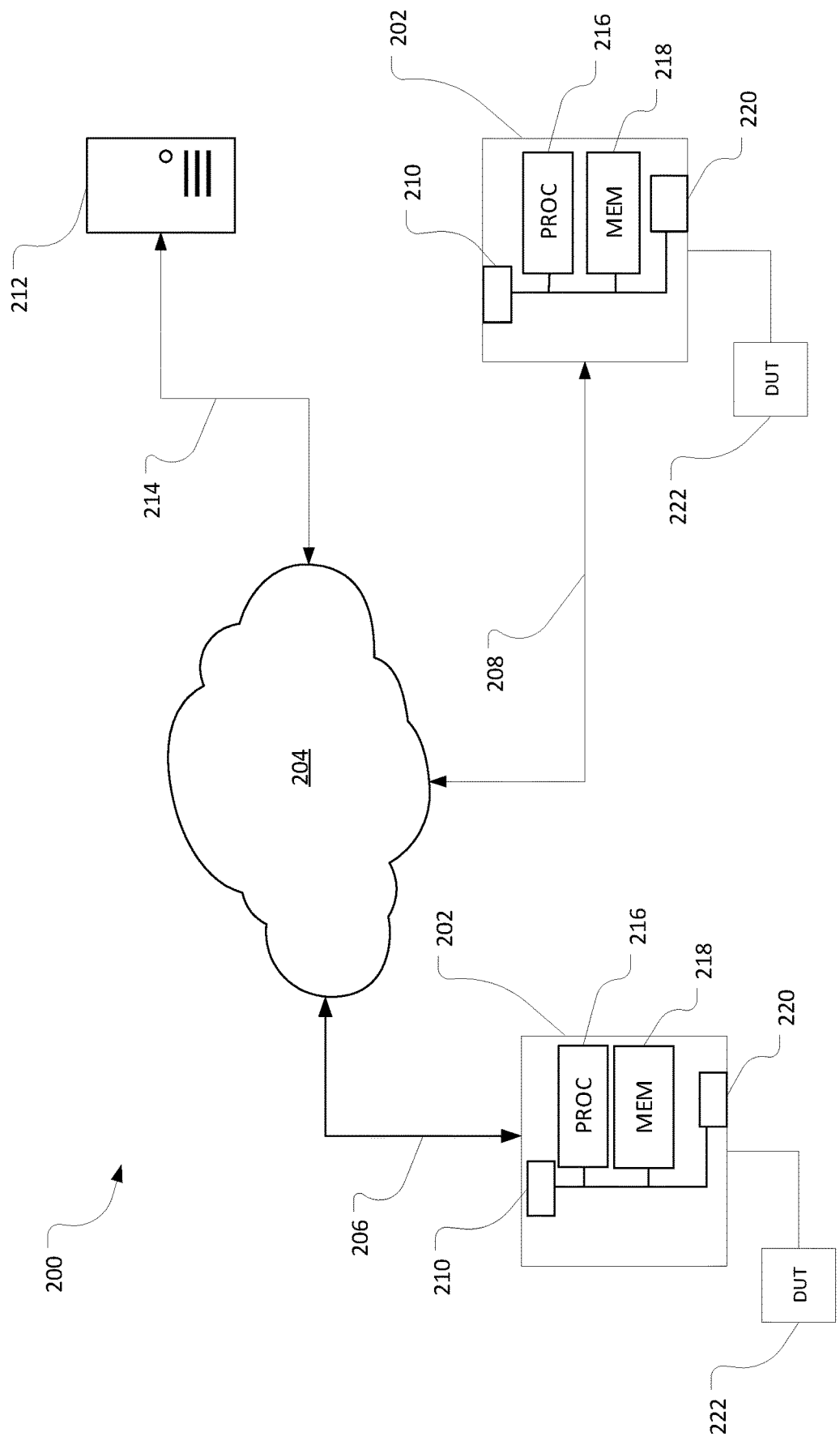
FIG. 2 is a block diagram of a test and measurement system according to some examples of the disclosure.

FIG. 2 illustrates a block diagram of an example system 200 according to some examples of the disclosure. In the example system 200 of FIG. 2, one or more test and measurement instruments 202 can be connected through a network 204 by communications links 206 and 208, respectively. Communications links 206 and 208 may connect to the instrument 202 through a port 210. Communications links 206 and 208 may be wired or wireless connections.

The test and measurement instruments 202 can connect to a server 212. The server 212 may be a proprietary server owned by the entity that owns the instrument 202 or may be a cloud server on which the entity has accounts or otherwise has permitted access. The server 212 can have a memory that stores a database or can access a memory with a database of stored data. The server 212 may connect to the other instruments 202 through the network 204 by connection 214. The server 212 may have a data analyzer, which may be any known processor, to analyze newly received data based on data stored within the database of the memory of the server 212. The server 212 may also include a health score generator, as discussed in more detail below.

The instruments 202 may have a processor 216 and a memory 218, along with other hardware components, such as a display, analog to digital converters, etc. The instrument 202 may have a user interface 220 for receiving commands, selections, or other input from a user. Also, as shown, the instruments 202 may be connected to DUTs 222.

The database accessible to the server 212 can include test results from a large number, such as hundreds, thousands, or eventually millions, etc., of different combinations of silicon products, mother boards, and add-in cards with different test and measurement instruments, such as margin testers 100, bit error rate testers, oscilloscopes, vector network analyzers, etc., from as many different vendors as possible. The test results may also include simulated or predictive data, such as discussed in U.S. Provisional Application No. 63/081, 265, titled "MARGIN TEST DATA TAGGING AND PREDICTIVE EXPECTED MARGINS," filed on Sep. 21, 2020, the disclosure of which is incorporated herein by reference in its entirety. In some examples, the database may be opt in or open source so that when tests are performed on DUTs 222 by the test and measurement instrument 202, the information related to the test, such as the DUT 222 type, specific test and measurement instrument 202, any accessories used, etc., as well as the test result can be transmitted to the server 212 to be stored in the memory database. The memory database can also include temporal data of design revision data for particularly tested DUTs and the changes that were made in each design revision.

Figure 3:
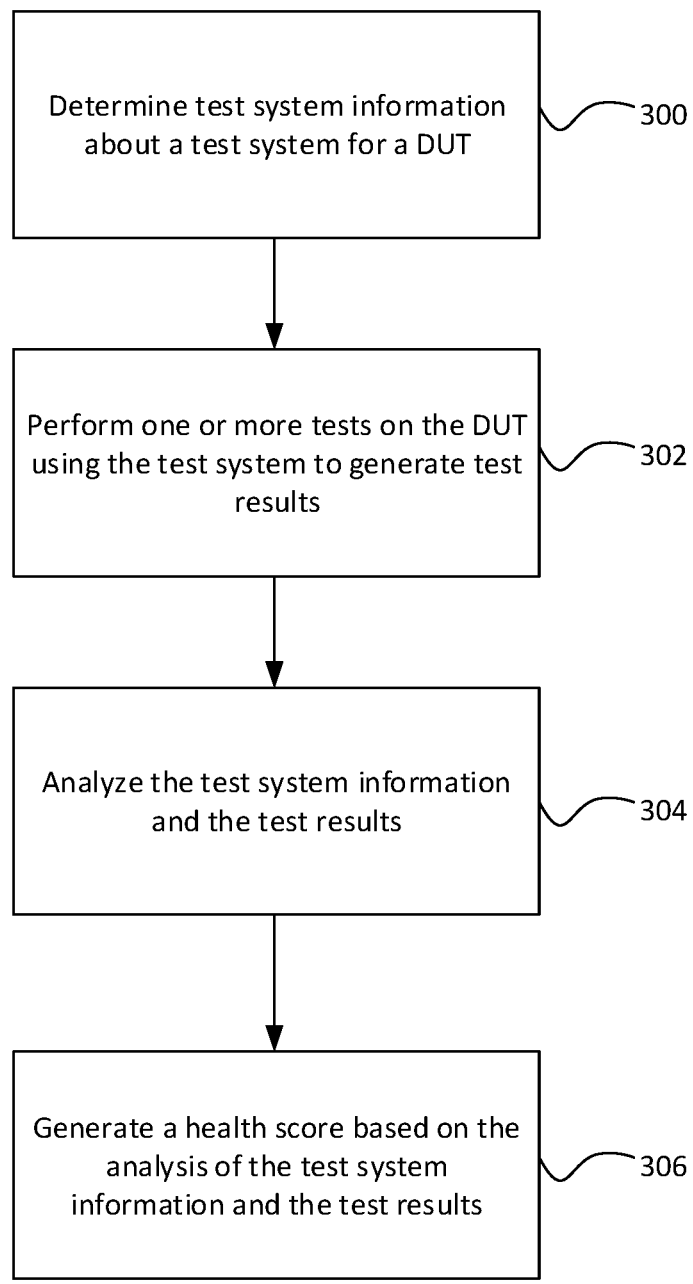
FIG. 3 is a flow chart for analyzing a device under test according to some examples of the disclosure.

FIG. 3 illustrates a flow chart according to some examples of the disclosure. In operation 300, test system information can be determined or gathered, as well as information about the DUT. For example, such information may include the test and measurement instrument 202 type and/or identifier, accessories used, and information about the DUT 222, such as information about any silicon products, motherboards, or add in cards used in the DUT 222.

The information can be gathered in any number of ways. For example, the information may be gathered from the user input 220 or may be determined based on an image, such as a photograph, of the DUT 222. Additionally or alternatively, the information may be gathered using an electrical signal from the DUT 222.

In operation 302, testing may be performed with the DUT 222 to generate test results. The test results and the test system information from operation 300 can be sent to the server 212 for analysis. The test results and the test system information can be sent through the network 204 or may be sent directly to the server 212, either through a wired or wireless connection. In some examples, the test results may not be from a test and measurement instrument 202, but may be results from a simulation program. In such a situation, the test system information would only include information about the simulation.

In operation 304, the server 212 can analyze the test system information in operation 300 and the test results in operation 302 and generate a health score based on the analysis in operation 304. The analysis of the data in operation 304 can include determining how the test system information and/or the test results relates to data that is stored within the memory database. For example, the server 212 can recognize similar product families built off a similar silicon product and compare the test results to that data. The analysis in operation 304 can also include, for example, selecting a particular test item from a DUT, such as an eye height or an eye width. The server 212 can identify similar silicon products or product families from the memory database accessed by the server 212 and generate a trend plot of their results of the same particular test item based on a specific time period.

The health score can be generated, for example, by comparing the particular test item to a compliance test specification. The health score is generated based on how closely the particular test item meets the compliance test specification. For example, a particular compliance test specification may require an eye height or width that meet or exceeds a particular height or width. A lower health score is generated if the particular test item does not meet the compliance test specification, while a higher health score is generated if the particular test item exceeds the compliance test specification. The trend plot of the DUT and the similar silicon products or product families can also be displayed, along with the health score, to a user so a user can assess the DUT design compared to other similar products. That is, the health score can indicate if the DUT was below, met, or exceeded the compliance test specification.

The health score can include a confidence score about the health of the DUT, pass/fail data on specific parameters related to the DUT, and/or compliance test results. Additionally or alternatively, the analysis can include determining if any changes made in similar product families stored in the data base resulted in improved confidence, pass/fail or compliance scores. If revision data is stored in the memory database for similar product types, then the server 212 can suggest design changes or other troubleshooting tips for the DUT 222. For example, the server 212 can determine that a certain accessory, such as a cable, is worn and should be replaced and may alert a user to change out the cable and rerun the test. Additionally or alternatively, the server 212 can determine that changing a particular component of the board, such as a differently sized resistor, may result in an improved score for the DUT 222 and output that information to the test and measurement instrument 202.

For example, a designer may take a silicon product and design a new video card. The designer can test an early version of the new video card using a margin tester 100 discussed above. The electrical margin data gathered during the test can be sent to the server 212.

The server 212 can recognize data in the memory database for similar video cards built on a similar silicon product and can analyze the designers data based on the existing data. The data for similar video cards can include timing data, electrical data, two-dimensional eye data, etc. The server 212 can output a health score about the health of the design based on both the test results and the test results of other similar video cards built on a similar silicon product. For examples, the server 212 can compare the design of the new video card to known video cards in the memory database and can determine any differences and the differences between the test results. Based on this data, the server 212 can determine whether the current video card is performing as well or better than other video cards stored in the memory database. Based on this information, the server 212 can generate a confidence score about the health of the designed board. The server 212 may also output pass/fail data on specific parameters and results of any compliance tests.

Additionally or alternatively, the server 212 can recall and classify revisions to designs for the similar video cards that improved the scores and results of those similar video cards. Based on those design revisions, the server 212 can recommend a design change to the designer. For example, if the server 212 finds that other designers had issues with lane 4 of their designed video card, but a solution was found that fixed the issue, then the server 212 can recognize that the current video card may have the same issue and the server 212 may output: "Design failed to pass PCIe gen 4 compliance on the transmission side because of lane 4. We recommend adding a different resistor family to the line."

By having a mixture of temporal data, such as testing each protoboard revision with the test and measurement instrument 202, as well as having a user input data on the steps/benefits taken between each revision, a neural network in the server 212 could be trained to divide the different board layouts for each protoboard into different risk levels. This can then be fed back into physical simulation tools that can allow designers to anticipate flaws earlier in their designs. Further, it may allow for new simulated designs to be compared against the data in the memory database for existing option references.

For example, a simulated design may be sent to server 212 and the server 212 can search the memory database for similar type designs and may be able to provide information regarding the health of the design without even performing any tests on a DUT. The mix of correlated data, human input, and lifecycle data within the memory database accessed by the server 212 could increase the value of simulation data dramatically over current single use models.

Examples of the disclosure may also provide universal compliance tools, which may be adopted by special interest groups for quicker and cheaper compliance testing. Currently, DUTs are taken to compliance events, such as a plug fest, power on, or other compliance events to receive a compliance stamp for the DUT.

However, the database accessed by the server 212 in a memory can be a multi-vendor database. By collecting the actual test margins for multiple permutations of boards and/or accessories, the server 212 may act as a virtual compliance checker. To build the virtual compliance checker using examples of the disclosure, the memory database is first built from test results, such as from a margin tester 100 as per the current guidelines. Once enough data is within the memory database, it is possible to catch the majority of variables in DUTs 222 so that the compliance stamp may be given by referencing the test results from a DUT 222 to the data within the database.

Further, as new generations of protocols for devices are developed, examples of the disclosure can be used to assist with writing specifications for the special interest groups by indicating common problem areas for the designs of the devices.

With respect to margin testing in particular, many companies that produce silicon products provide an on die electrical margin checker in the package with the silicon product. The on die electrical margin checker, along with standard test documentation, is given to designers in downstream companies who deploy the silicon products in various ways, such as for mother boards, graphic cards, etc.

The designers will often test the electrical health of their products that use the silicon product with the results sometimes being very different from those provided by the silicon product provider. It is not uncommon for silicon product providers to say the silicon product passed with healthy electrical margins and a board designer to indicate that the product has failed and is unusable. The discrepancy can cause issues between the silicon product provider and the designer.

Both the silicon provider and the designer can upload their designs and tests to the memory database accessed by the server 212. The server 212 can review the information from both the silicon provider and the designer and access other information in the database. By analyzing this data, the server 212 can determine any design issues with either the silicon product or the designed board, and could, in some examples, provide an output with information regarding what changes made by the designer are causing the issue and potential fixes. For example, high speed serial data analysis may use eye diagrams to quickly check the signal integrity and most standards have defined eye diagrams limits for eye height and eye width. The channel loss of a board of a DUT can impact the eye height. As such, if the server 212 notices or determines there are issues with eye height, the server 212 may be able to determine there is a design issue with channel loss of the DUT board. Alternatively, the server 212 may be able to output information regarding the issues present with the silicon product and what changes can be made to correct the issues.

In some examples, the server 212 can include machine learning to allow the server 212 to computationally design new layouts. Definitions of success, such as power requirements, size, etc. can be uploaded to the server 212 and the server 212 can use this information to organically design new board layouts for users when troubleshooting issues with the DUTs 222.

In operation 304 discussed above, the test system information may include component manufacturing information. The server 212 can then compare data across all vendors and be able to recognize a bad batch of elements or components. The server 212 can then output a warning or recommendation to a designer to change out the element or component that has caused issues in other DUTs 222.

Additionally or alternatively, in some examples the server 212 can determine if certain portions of a DUT 222 are over-engineered. For example, the server 212 may find that certain portions of the DUT 222 never fail or have other issues, the server 212 may flag those portions of the DUT 222 as potentially being over-engineered. The server 212 can output this information in operation 306 and offer suggestions for alternative components that are less expensive, smaller, use less power, etc. In some examples, using examples discussed above, the server 212 may be able to simulate the board with the design changes prior to outputting the suggestions. The output may then also include the results of the simulation.

Examples of the disclosure can reduce the amount of time and manual labor required for designing new products. Examples of the disclosure are able to provide information about the device under test that was previously unavailable, by analyzing the device under test in light of data from tests performed on past devices under test. This can allow a designer to decrease the amount of re-work or re-design of the device under test by helping to guide the designer to designs that have worked for others that are working on similar products.

Aspects of the disclosure may operate on particularly created hardware, firmware, digital signal processors, or on a specially programmed computer including a processor operating according to programmed instructions. The terms controller or processor as used herein are intended to include microprocessors, microcomputers, Application Specific Integrated Circuits (ASICs), and dedicated hardware controllers. One or more aspects of the disclosure may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a computer readable storage medium such as a hard disk, optical disk, removable storage media, solid state memory, Random Access Memory (RAM), etc. As will be appreciated by one of skill in the art, the functionality of the program modules may be combined or distributed as desired in various aspects. In addition, the functionality may be embodied in whole or in part in firmware or hardware equivalents such as integrated circuits, FPGA, and the like. Particular data structures may be used to more effectively implement one or more aspects of the disclosure, and such data structures are contemplated within the scope of computer executable instructions and computer-usable data described herein.

The disclosed aspects may be implemented, in some cases, in hardware, firmware, software, or any combination thereof. The disclosed aspects may also be implemented as instructions carried by or stored on one or more or computer-readable storage media, which may be read and executed by one or more processors. Such instructions may be referred to as a computer program product. Computer-readable media, as discussed herein, means any media that can be accessed by a computing device. By way of example, and not limitation, computer-readable media may comprise computer storage media and communication media.

Computer storage media means any medium that can be used to store computer-readable information. By way of example, and not limitation, computer storage media may include RAM, ROM, Electrically Erasable Programmable Read-Only Memory (EEPROM), flash memory or other memory technology, Compact Disc Read Only Memory (CD-ROM), Digital Video Disc (DVD), or other optical disk storage, magnetic cassettes, magnetic tape, magnetic disk storage or other magnetic storage devices, and any other volatile or nonvolatile, removable or non-removable media implemented in any technology. Computer storage media excludes signals per se and transitory forms of signal transmission.

Communication media means any media that can be used for the communication of computer-readable information. By way of example, and not limitation, communication media may include coaxial cables, fiber-optic cables, air, or any other media suitable for the communication of electrical, optical, Radio Frequency (RF), infrared, acoustic or other types of signals.

EXAMPLES

Illustrative examples of the technologies disclosed herein are provided below. A configuration of the technologies may include any one or more, and any combination of, the examples described below.

Example 1 is a test and measurement system, comprising a memory configured to store a database of test results related to tests performed with one or more prior devices under test; an input configured to receive new test results about a new device under test; a data analyzer configured to analyze the new test results based on the stored test information data; and a health score generator configured to generate a health score for the new device under test based on the analysis from the data analyzer.

Example 2 is the test and measurement system of example 1, wherein the new test results include test results of the new device under test from a test and measurement instrument.

Example 3 is the test and measurement system of example 2, wherein the test and measurement instrument is a margin tester.

Example 4 is the test and measurement system of any one of examples 1-3, wherein the new test results include test system information.

Example 5 is the test and measurement system of any one of examples 1-4, wherein the new test results include simulation data.

Example 6 is the test and measurement system of any one of examples 1-5, wherein the health score generator is further configured to generate compliance test results.

Examples 7 is the test and measurement system of any one of examples 1-6, wherein the stored test results include revision data from at least one of the prior devices under test.

Example 8 is the test and measurement system of example 7, wherein the data analyzer is further configured to determine suggested improvements for the new device under test based on the analysis and the health score generator is further configured to output the suggested improvements with the health score.

Example 9 is a method for analyzing a new device under test, comprising storing test results related to tests performed with one or more prior devices under test; receiving new test results about the new device under test; analyzing the new test results based on the stored test results; and generating a health score for the new device under test based on the analysis.

Example 10 is the method of example 9, wherein the new test results include test results of the new device under test from a test and measurement instrument.

Example 11 is the method of example 10, wherein the test and measurement instrument is a margin tester.

Example 12 is the method of any one of examples 9-11, wherein the new test results include test system information.

Example 13 is the method of any one of examples 9-12, wherein the new test results include simulation data.

Example 14 is the method of any one of examples 9-13, further comprising generating compliance test results based on the analysis.

Example 15 is the method of claim 9, wherein the stored test results include revision data from at least one of the prior devices under test.

Example 16 is the method of example 15, further comprising determining suggested improvements for the new device under test based on the analysis and outputting the suggested improvements with the health score.

Example 17 is one or more non-transitory computer-readable storage media comprising instructions, which, when executed by one or more processors of a test and measurement system, cause the test and measurement instrument to receive new test results about a new device under test; analyze the new results based on stored test results of one or more prior devices under test; and generate a health score for the new device under test based on the analysis.

Example 18 is the one or more non-transitory computer-readable storage media of example 17, wherein the new results include tests results of the new device under test from a test and measurement instrument.

Example 19 is the one or more non-transitory computer-readable storage media of example 18, wherein the test and measurement instrument is a margin tester.

Example 20 is the one or more non-transitory computer-readable storage media of any one of examples 17-19, wherein the new test results include simulation data.

The previously described versions of the disclosed subject matter have many advantages that were either described or would be apparent to a person of ordinary skill. Even so, these advantages or features are not required in all versions of the disclosed apparatus, systems, or methods.

Additionally, this written description makes reference to particular features. It is to be understood that all features disclosed in the specification, including the claims, abstract, and drawings, and all the steps in any method or process disclosed, may be combined in any combination, except combinations where at least some of such features and/or steps are mutually exclusive. Each feature disclosed in the specification, including the claims, abstract, and drawings, can be replaced by alternative features serving the same, equivalent, or similar purpose, unless expressly stated otherwise.

Also, when reference is made in this application to a method having two or more defined steps or operations, the defined steps or operations can be carried out in any order or simultaneously, unless the context excludes those possibilities.

Although specific examples of the disclosure have been illustrated and described for purposes of illustration, it will be understood that various modifications may be made without departing from the spirit and scope of the disclosure. Accordingly, the disclosure should not be limited except as by the appended claims.

We claim:

1. A test and measurement system, comprising:
a memory configured to store a database of test results related to tests performed with one or more prior devices under test;
one or more connectors configured to electrically connect a test and measurement instrument to a new device under test and to receive an input of new test results about the new device under test;
cables to connect the test and measurement instrument to the new device under test; and
a processor configured to execute code, the code to cause the processor to:
perform an analysis on the new test results based on the stored test results; and
generate a health score for the new device under test based on the analysis.

2. The test and measurement system of claim 1, wherein the test and measurement instrument is a margin tester.

3. The test and measurement system of claim 1, wherein the new test results include test system information.

4. The test and measurement system of claim 1, wherein the new test results include simulation data.

5. The test and measurement system of claim 1, wherein the processor is further configured to execute code to generate compliance test results.

6. The test and measurement system of claim 1, wherein the stored test results include revision data from at least one of the prior devices under test.

7. The test and measurement system of claim 6, wherein the processor is further configured to execute code to determine suggested improvements for the new device under test based on the analysis and to output the suggested improvements with the health score.

8. A method for analyzing a new device under test, comprising:
storing test results related to tests performed with one or more prior devices under test in a memory configured to store the test results in a database;
connecting the new device under test to a test and measurement instrument using one or more cables;
receiving new test results about the new device under test through an interface on the test and measurement instrument electrically connected to the new device under test through the cables;
analyzing the new test results based on the stored test results stored in the memory; and
generating a health score for the new device under test based on the analysis.

9. The method of claim 8, wherein the test and measurement instrument is a margin tester.

10. The method of claim 8, wherein the new test results include test system information.

11. The method of claim 8, wherein the new test results include simulation data.

12. The method of claim 8, further comprising generating compliance test results based on the analysis.

13. The method of claim 8, wherein the stored test results include revision data from at least one of the prior devices under test.

14. The method of claim 13, further comprising determining suggested improvements for the new device under test based on the analysis and outputting the suggested improvements with the health score.

15. One or more non-transitory computer-readable storage media comprising instructions, which, when executed by one or more processors of a test and measurement system, cause the test and measurement system to:
- receive new test results about a new device under test through an interface on a test and measurement instrument electrically connected to the new device under test through a cable;
- analyze the new test results based on stored test results of one or more prior devices under test stored in a memory; and
- generate a health score for the new device under test based on the analysis.

16. The one or more non-transitory computer-readable storage media of claim 15, wherein the test and measurement instrument is a margin tester.

17. The one or more non-transitory computer-readable storage media of claim 15, wherein the new test results include simulation data.

\* \* \* \* \*